(12) United States Patent
Kim et al.

(10) Patent No.: US 7,929,330 B2
(45) Date of Patent: Apr. 19, 2011

(54) MULTI-BIT MEMORY DEVICE USING MULTI-PLUG

(75) Inventors: Deok-kee Kim, Seoul (KR); Ha-young You, Seoul (KR); Young-chang Joo, Seoul (KR); Jung-hun Sung, Yongin-si (KR); Soo-jung Hwang, Seoul (KR); Sung-yup Jung, Seoul (KR)

(73) Assignees: Samsung Electronics Co., Ltd., Gyeonggi-do (KR); Seoul National University Industry Foundation, Seoul (KR)

( * ) Notice: Subject to any disclaimer, the term of this patent is extended or adjusted under 35 U.S.C. 154(b) by 112 days.

(21) Appl. No.: 12/379,894

(22) Filed: Mar. 4, 2009

(65) Prior Publication Data

US 2009/0225581 A1 Sep. 10, 2009

(30) Foreign Application Priority Data

Mar. 4, 2008 (KR) .................. 10-2008-0020200

(51) Int. Cl.
*G11C 17/06* (2006.01)
(52) U.S. Cl. ............. 365/94; 365/72; 365/105; 365/175
(58) Field of Classification Search .................. 365/105, 365/175
See application file for complete search history.

(56) References Cited

U.S. PATENT DOCUMENTS

| 4,494,135 | A | * | 1/1985 | Moussie | ......................... 257/50 |
| 6,072,716 | A | * | 6/2000 | Jacobson et al. | ............... 365/163 |
| 6,737,691 | B2 | * | 5/2004 | Asao | ............................. 257/295 |
| 7,379,317 | B2 | * | 5/2008 | Bill et al. | ......................... 365/72 |
| 7,586,773 | B2 | * | 9/2009 | Herner | ............................ 365/105 |

FOREIGN PATENT DOCUMENTS

| JP | 2004-247360 | 9/2004 |
| JP | 2005-051152 | 2/2005 |
| KR | 2003-0002044 | 1/2003 |

* cited by examiner

*Primary Examiner* — Tan T. Nguyen
(74) *Attorney, Agent, or Firm* — Harness, Dickey & Pierce, P.L.C.

(57) ABSTRACT

A memory device may include a cathode, an anode, a link connected to the anode, and a first connection element that connects the link to the cathode. The link and the anode may be located in a position lower than that of the cathode or the link and the anode may be located in a position higher than that of the cathode. Also, the cathode, the anode, the link, and the first connection element may be formed on the same plane.

20 Claims, 9 Drawing Sheets

MULTI-BIT MEMORY DEVICE USING MULTI-PLUG

PRIORITY STATEMENT

This application claims the benefit of Korean Patent Application No. 10-2008-0020200, filed on Mar. 4, 2008, in the Korean Intellectual Property Office, the disclosure of which is incorporated herein in its entirety by reference.

BACKGROUND

1. Field

Example embodiments relate to a memory device and methods of manufacturing and operating the same, for example, to a one time programmable (OTP) memory device that uses multi-plugs and methods of manufacturing and operating the same.

2. Description of the Related Art

Electronic apparatuses are being miniaturized rapidly so that users can conveniently transport the electronic apparatuses. Furthermore, the rate of miniaturization of the electronic apparatuses is expected to increase in the near future. However, the miniaturization of the electronic apparatuses generally requires an increase in the integration density of semiconductor devices.

The miniaturization of the electronic apparatuses is inseparably related to the increase in the integration density of semiconductor devices, which is performed by forming as many semiconductor devices as possible in an area.

In order to further increase the integration density of semiconductor devices, a technique that can process a line width of the semiconductor devices narrowly is important. Conventional semiconductor techniques propose a line width processing technique at a nano level. However, due to physical limitations, it is not possible to process the line width to an infinitely narrow level. That is, there is a limit in increasing the integration density of semiconductor devices by increasing the number of semiconductor devices to be formed in an area.

As a method of overcoming the above limitation, a semiconductor device that can only store one bit data may be replaced by a multi-bit data semiconductor device. For example, a semiconductor device that may store at least two bit data.

Theoretically, if a semiconductor device that stores one bit data is replaced by a semiconductor device that stores two bit data, the integration density of the semiconductor device may be doubled.

Thus, recently, a multi-bit semiconductor device having a storage node that includes a material that has various memory characteristics and has various shapes, such as a multi-bit memory device, has been disclosed.

SUMMARY

Example embodiments provide a memory device that enables a multi-bit program and an increase in the integration density.

According to example embodiments, a memory device may include a cathode, an anode, a link connected to the anode, and a first connection element that connects the link to the cathode.

In example embodiments, the first connection element may include at least one plug, and the plug may be one of a single layer and multiple layer, where the multiple layer includes a central layer and an external layer that surrounds the central layer.

In example embodiments, the link and the anode may be located in a position lower than a position of the cathode.

In example embodiments, the link and the anode may be located in a position higher than a position of the cathode.

In example embodiments, the cathode, the anode, the link, and the first connection element may be formed on the same plane.

In example embodiments, the cathode, the anode, and the link may be formed on the same plane and the first connection element may be separately formed from the plane.

In example embodiments, the cathode and the anode may be located in a position higher than a position of the link.

In example embodiments, the anode and the link may be connected through a second connection element.

In example embodiments, the second connection element may include at least one plug, and the plug may be one of a single layer and multiple layer, where the multiple layer includes a central layer and an external layer that surrounds the central layer.

In example embodiments, the cathode, the anode, and the link may be formed in one of single layers and multiple layers.

In example embodiments, the cathode, the anode, the link, and the first connection element may be one of single layers and multiple layers.

In example embodiments, the memory device may write and read data by applying a single voltage between the cathode and the anode by comparing the measured resistance with a reference resistance, where the measured resistance uses a voltage in a range that does not form a void in the link applied between the cathode and the first anode.

In example embodiments, the link may include at least first, second and third material layers, where the second layer is between the first and third material layers and the second layer is a conductive layer.

In example embodiments, at least one of the first and third material layers may be one of Ta and TiN layers.

In example embodiments, the link may further include a fourth material layer above the first material layer and fifth material layer below the third material layer, and at least one of the fourth and fifth material layers may be one of Ti and TaN layers.

In example embodiments, the cathode may correspond to a gate line, the anode and the link may correspond to a metal wire connected to the gate line, and the first connection element may connect the gate line to the metal wire.

In example embodiments, the first connection element may include at least one wire, and the at least one wire may extend between a substrate, the cathode and the anode.

In example embodiments, the cathode may include at least an upper layer and a lower layer, where the lower and upper layers are one polysilicon and silicide material layers.

In example embodiments, the material layers may be one of vertically stacked and horizontally arranged on the same plane.

According to example embodiments, a memory device may include a cathode, an anode, a link that is connected to the anode, and a first connection element that connects the link to the cathode, where the first connection element includes a plurality of plugs. The link may vary an electrical resistance between the cathode and the anode by selectively contacting one or more of the plurality of plugs based on a voltage applied between the cathode and the anode.

In the method of operating the memory device, the voltage may be a program voltage to form a void in a portion of the link that contacts the connection element or a read voltage to read data stored in the link.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
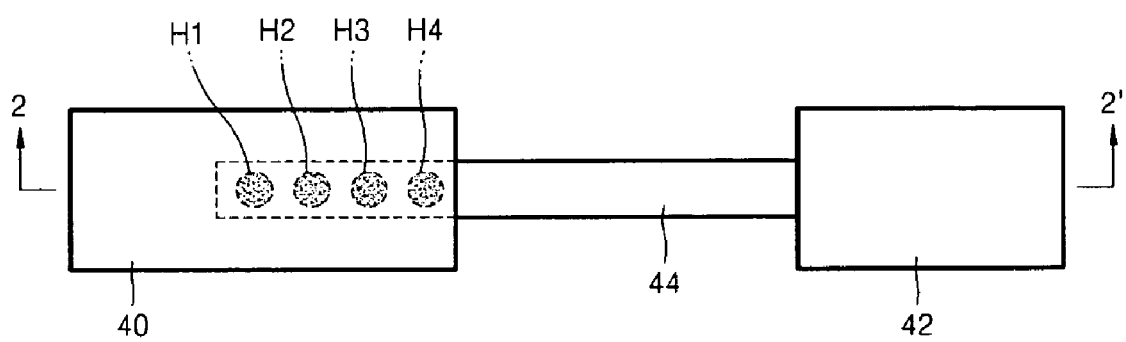
FIG. 1 is a plan view of a first memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

When it is determined that a detailed description related to a related known function or configuration may make the purpose of example embodiments unnecessarily ambiguous, the detailed description thereof will be omitted. Also, terms used herein are defined to appropriately describe the exemplary embodiments and thus may be changed depending on a user, the intent of an operator, or a custom. Accordingly, the terms must be defined based on the following overall description within this specification.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments will now be described more fully with reference to the accompanying drawings. In the drawings, the thicknesses of layers and regions may be exaggerated for clarity.

A multi-bit memory device that uses multi-plugs according to example embodiments and a method of operating the same will now be described.

First, a memory device according to example embodiments will now be described.

Figure 2:
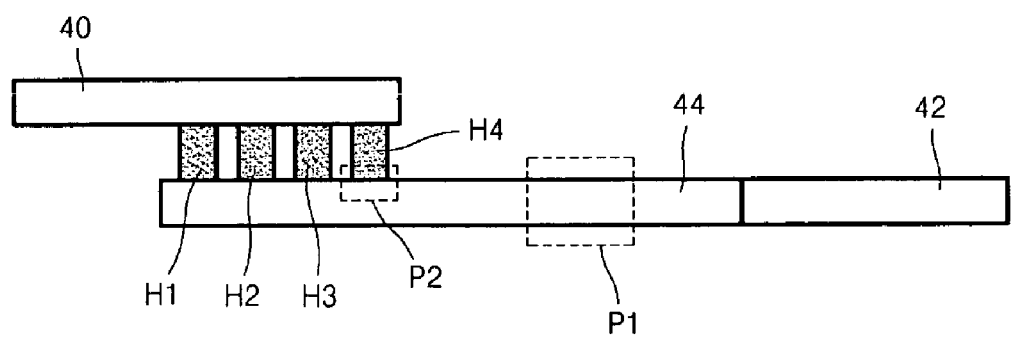
FIG. 2 is a cross-sectional view taken along 2-2' of FIG. 1.

FIG. 1 is a plan view of a memory device that uses multi-plugs (hereinafter, a first memory device), according to example embodiments. FIG. 2 is a cross-sectional view taken along 2-2' of FIG. 1.

Referring to FIGS. 1 and 2, the first memory device may include a first cathode 40, a first anode 42, and a link (or a link unit) 44. A first end of the link 44 is connected to the first anode 42. The first anode 42 and the link 44 may be one unit. In FIGS. 1 and 2, the first anode 42 and the link 44 are referred to separately since the first anode 42 and the link 44 respectively have their own terminologies and functions. Thus, the first anode 42 and the link 44 may also be considered as divided units. A second end of the link 44 is connected to the first cathode 40 through first through fourth plugs H1 through H4 that are separate from each other. The first cathode 40 and the first anode 42 may have the same thickness, and the first cathode 40 may have an area greater than that of the first anode 42. While FIGS. 1 and 2 only show four plugs, in example embodiments the number of plugs that connect the second end of the link 44 to the first cathode 40 may be more than four or less than four. The number of states that may be shown by the first memory device varies according to the number of plugs that connect the second end of the link 44 to the first cathode 40. For example, if the second end of the link 44 is connected to the first cathode 40 only through the first plug H1 (hereinafter, a first case), the first memory device may exhibit two states. For example, one of the states may be a first state in which there is a low electrical resistance between the link 44 and the first cathode 40 and the other state may be a second state in which there is a high electrical resistance between the link 44 and the first cathode 40.

When a voltage, for example, a writing voltage or a programming voltage is applied between the first cathode 40 and the first anode 42, a void may be formed in a portion of the link 44 that contacts the first plug H1. As a result, an electrical resistance between the first cathode 40 and the first anode 42 may increase, and the first memory device may be referred to as being in the second state. The void may be formed by electromigration. The first state may be in a state in which the void is not formed. In the case when the first cathode 40 and the link 44 are connected through the first through fourth plugs H1 through H4 (hereinafter, a second case), the void may be expanded along the link 44 from a portion of the link 44 that contacts the first plug H1 to a portion of the link 44 that contacts the fourth plug H4 according to the voltage.

In the second case, when the void is present only to a first portion of the link 44, for example, to a portion of the link 44 that contacts the first plug H1, the first memory device may be referred to as being in a third state. Also, when the void is present to the first and second portions of the link 44, the first memory device may be referred to as being in a fourth state. The second portion indicates a portion of the link 44 that contacts the second plug H2. Also, when the void is present to the first and second portions and the third portion of the link 44, the first memory device may be referred to as being in a fifth state. The third portion indicates a portion of the link 44 that contacts the third plug H3. Also, when the void is present to the first through third portions and to the fourth portion of the link 44, the first memory device may be referred to as being in a sixth state. The fourth portion indicates a portion of the link 44 that contacts the fourth plug H4.

In this manner, in the second case, the first memory device may exhibit four states such as the third through sixth states. Thus, in the second case, the first memory device may store two-bit data. For example, a first selected state of the third through sixth states may exhibit a two bit data of "00", a second selected state of the third through sixth states may exhibit a two bit data of "01", a third selected state of the third through sixth states may exhibit a two bit data of "10", and a fourth selected state of the third through sixth states may exhibit a two bit data of "11".

Thus, the first memory device may store more than two-bit data by connecting the link 44 to the first cathode 40 using more than four plugs as described above.

In this regards, the regions where the void is formed may be regarded as a program region.

As described above, the void region formed at the link 44 may vary according to the third through sixth states. Therefore, the electrical resistance of the first memory device may vary according to the third through sixth states. For example, this may denote that the electrical resistance of the first memory device varies according to the data stored in the first memory device. Data stored in the first memory device may be read using such characteristic.

More specifically, if a voltage in a range that does not form a void in the link 44 is applied between the first cathode 40 and the first anode 42, the resistance of the first memory device may be measured without changing the state of the first memory device, that is, without changing a void region formed in the link 44. Thus, the resistance measured in this way may correspond to one of the third through sixth states, and hence, data stored in the first memory device may be read by comparing the measured resistance with a reference resistance.

In this way, the first memory device according to example embodiments may write or read data by applying a single voltage between the first cathode 40 and the first anode 42, thereby reducing operation time.

The first cathode 40, the first anode 42, and the link 44 may be formed of either Al or Cu, or may be formed of another conductive material. Also, the first cathode 40, the first anode 42, and the link 44 may be a single layer, or may be a multiple layer as described below.

Figure 3:
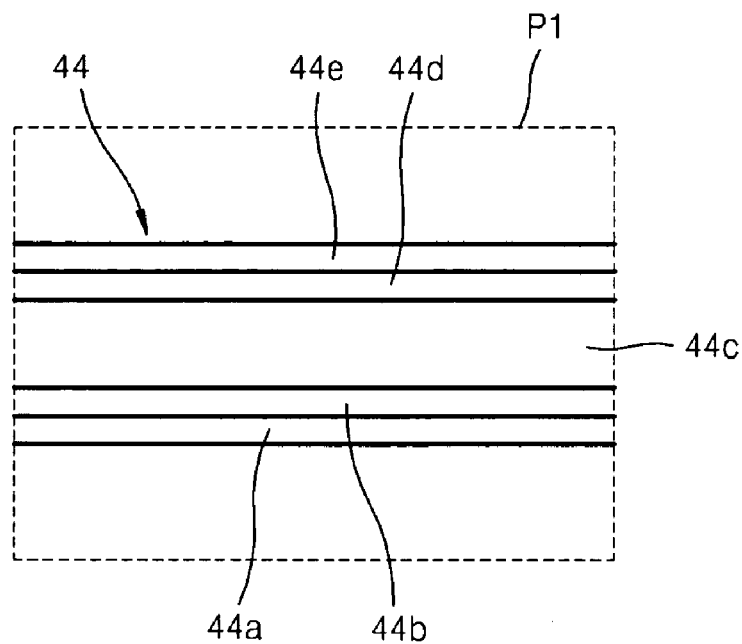
FIG. 3 is a magnified cross-sectional view of a portion of a link of FIG. 2.

FIG. 3 is a magnified cross-sectional view of a portion P1 of the link 44 of FIG. 2.

Referring to FIG. 3, the link 44 may include first through fifth material layers 44a through 44e which are sequentially stacked. The first material layer 44a may be a Ta layer or a TiN layer, or may be another material layer corresponding or superior to the Ta layer or the TiN layer. The second material layer 44b may be a Ti layer or a TaN layer, or may be another material layer corresponding or superior to the Ti layer or the TaN layer. The third material layer 44c is a conductive layer and may be, for example, one of an Al layer, a W layer, and a Cu layer. Alternatively, third material layer 44c may be another type of conductive layer. The fourth material layer 44d may be one of a Ti layer and a TaN layer, or may be another material layer corresponding or superior to the Ti layer or the TaN layer. The fourth material layer 44d and the second material layer 44b may be formed of the same material. The fifth material layer 44e may be one of a TiN layer and a Ta layer, or may be another material layer corresponding or superior to the Ta layer or the TiN layer. The fifth material layer 44e and the first material layer 44a may be formed of the same material.

The link 44, the first anode 42 and/or the first cathode 40 may be one unit. Thus, the same multiple layer configuration of the link 44 may be applied to the first anode 42 and/or the first cathode 40.

Figure 4:
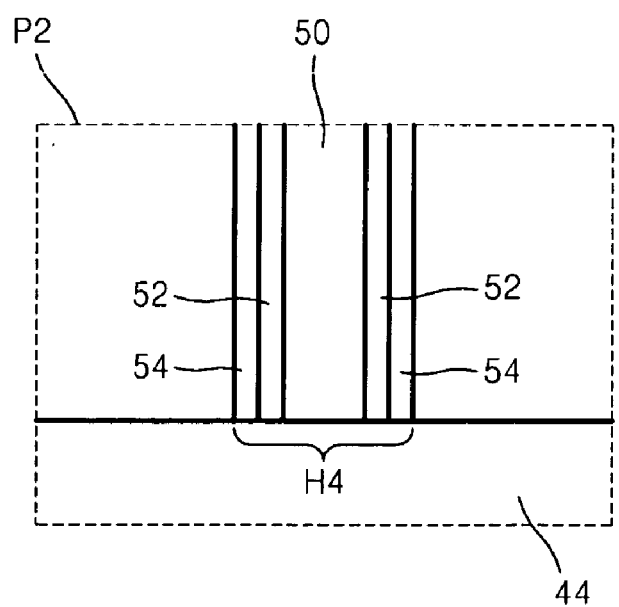
FIG. 4 is a magnified cross-sectional view of a portion of the link and a plug in contact with the link of FIG. 2.

FIG. 4 is a magnified cross-sectional view of a portion P2 that includes a portion of the link 44 and a portion of the fourth plug H4.

Referring to FIG. 4, the fourth plug H4 may include a central layer 50 and first and second external layers 52 and 54 that sequentially surround the central layer 50. The central layer 50 may be a W layer, a Cu layer, an Al layer, or another material layer corresponding or superior to such layers. The first external layer 52 may be, for example, a TiN layer or another material layer corresponding or superior to the TiN layer. The second external layer 54 may be, for example, a Ti layer or another material layer corresponding or superior to the Ti layer.

As described above, the configuration of the first cathode 40 may be identical to that of the link 44. Alternatively, the configuration of the first cathode 40 may be different from that of the link 44. For example, the first cathode 40 may correspond to a gate line, the first anode 42 and the link 44 may correspond to a metal wire connected to the gate line, and the first through fourth plugs H1 through H4 may be a means to connect the gate line to the metal wire.

In this case, the first anode 42 may have a multiple layer structure as described above, and the first through fourth plugs H1 through H4 may also have the configuration of the fourth plug H4. However, as depicted in FIG. 5, the first cathode 40 may be configured With a structure in which a lower layer 40a and an upper layer 40b are sequentially stacked.

Figure 5:
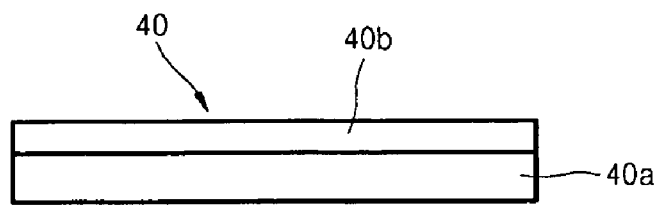
FIG. 5 is a cross-sectional view of a layer structure when a cathode of FIG. 2 corresponds to a gate line.

FIG. 5 is a cross-sectional view of a layer structure when a cathode of FIG. 2 corresponds to a gate line. The lower layer 40a may be, for example, a polysilicon layer, and the upper layer 40b may be, for example, a silicide layer. The silicide layer may be a W silicide layer, a Ti silicide layer, a Co silicide layer, or another silicide layer that can reduce sheet resistance.

A second memory device according to example embodiments will now described with reference to FIGS. 6 and 7.

Figure 6:
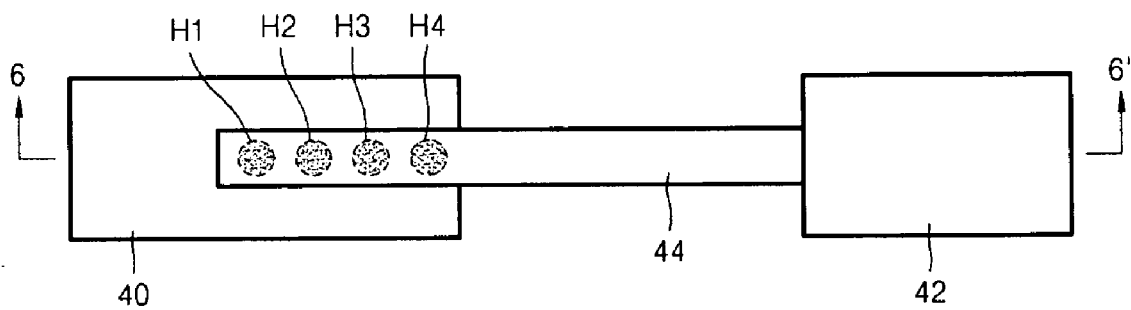
FIG. 6 is a plan view of a second memory device according to example embodiments.

FIG. 6 is a plan view of the second memory device according to example embodiments.

Figure 7:
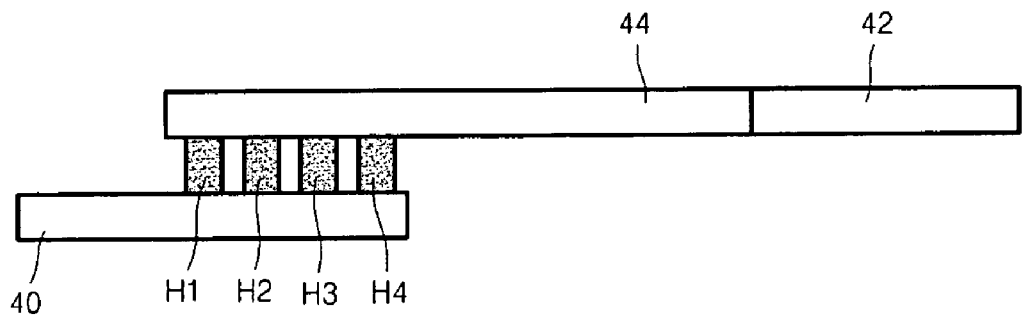
FIG. 7 is a cross-sectional view taken along line 6-6' of FIG. 6.

FIG. 7 is a cross-sectional view taken along line 6-6' of FIG. 6.

Like reference numerals are used to indicate elements that are substantially identical to the elements of the first memory device, and thus, only elements of the second memory device that are generally different from the first memory device will now be described.

Referring to FIGS. 6 and 7, unlike in the first memory device, in the second memory device, the first cathode 40 is located on a position lower than that of the link 44 and the first anode 42. A portion of the first cathode 40 is positioned below an end portion of the link 44, and is overlapped by the end portion of the link 44. A first end of the link 44 is connected to the first anode 42, and a second end (the end portion) of the link 44 is connected to the first cathode 40 through the first through fourth plugs H1 through H4.

In the case of the second memory device, even though the first cathode 40 is located below the link 44 and the first anode 42, the location of a void formed when a level voltage is applied between the first cathode 40 and the first anode 42 may not different from that of the void in the first memory device. For example, the void may expand from the first position to the fourth position of the link 44 according to the voltage being applied between the first cathode 40 and the first anode 42. Thus, the second memory device may also have four states that are different from each other like in the first memory device. Also, more than two bit data may be stored according to the number of plugs that connect the link 44 to the first cathode 40.

In the case of the second memory device, the first cathode 40 may correspond to a gate line and may have a layer structure in which a polysilicon layer and a silicide layer are sequentially stacked.

A third memory device according to example embodiments will now be described. Like reference numerals are used to indicate elements that are substantially identical to the elements of the first memory device.

Figure 8:
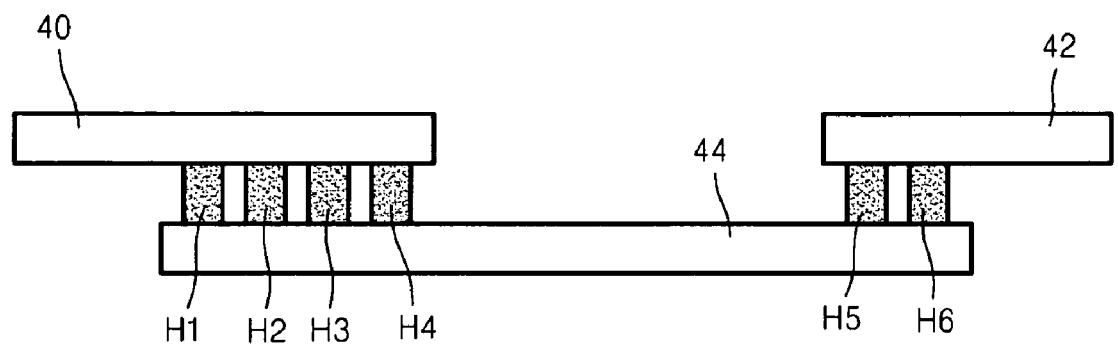
FIG. 8 is a cross-sectional view of a third memory device according to example embodiments.

FIG. 8 is a cross-sectional view of the third memory device according to example embodiments.

Referring to FIG. 8, the third memory device also includes the first cathode 40, the first anode 42, and the link 44. The link 44 is located on a position lower than that of the first cathode 40 and the first anode 42, and may be configured separately from the first anode 42. Thus, the configurations of the first anode 42 and the link 44 may be or may not be identical to each other. For example, if both the first anode 42 and the link 44 are formed of a single material, the first anode 42 and the link 44 may be formed of Al or Cu, or the first anode 42 and the link 44 may be formed of materials different from each other. If the first anode 42 and the link 44 are configured with multiple layers, the first anode 42 and the link 44 may have structures of the same material layers like in the first memory device, or may have structures of material layers different from each other. For example, the first anode 42 may have a structure in which a TiN layer, a Ti layer, an Al layer, a Ti layer, and a TiN layer are sequentially stacked, and the link 44 may have a structure in which a Ta layer, a TaN layer, a Cu layer, a TaN layer, and a Ta layer are sequentially stacked. The first cathode 40 may have a layer structure that is the same as the layer structure described in the first memory device.

A first end of the link 44 is connected to the first anode 42, and a second end of the link 44 is connected to the first cathode 40. In FIG. 8, the first end of the link 44 is connected to the first anode 42 through fifth and sixth plugs H5 and H6, and the second end of the link 44 is connected to the first cathode 40 through first through fourth plugs H1 through H4. The fifth and sixth plugs H5 and H6 may have configurations that are the same as or different from those of the first through fourth plugs H1 through H4.

In the first and second memory devices, one of the first cathode 40 and the first anode 42 may be formed of a single layer and the other one may be formed in multiple layers when the first anode 42 and the link 44 are one unit. Also, in the third memory device, at least one of the first cathode 40, the first anode 42, and the link 44 may be formed of a single layer and the rest of the cathode 40, the first anode 42, and the link 44 may be formed in multiple layers.

A fourth memory device according to example embodiments will now be described.

Figure 9:
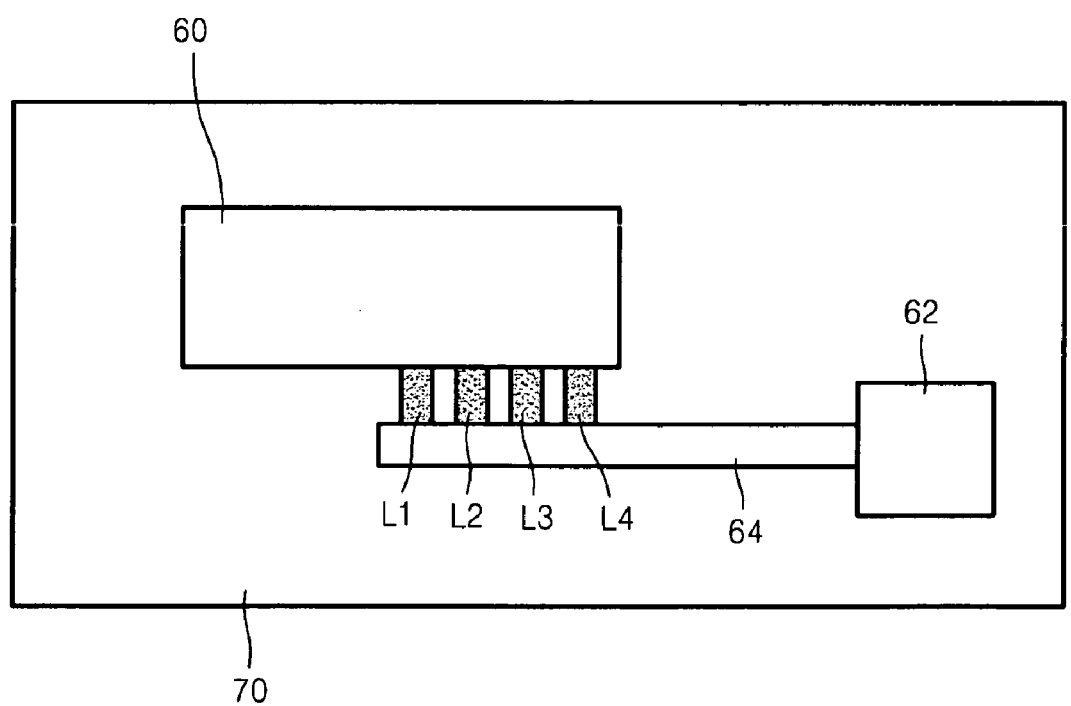
FIG. 9 is a plan view of a fourth memory device according to example embodiments.

FIG. 9 is a plan view of the fourth memory device according to example embodiments.

A main difference between the fourth memory device according to example embodiments and the first through third memory devices described above is that the first through third memory devices have layer structures in which constituent elements are vertically stacked. However, in the fourth memory device, all constituent elements are horizontally arranged on the same plane.

Referring to FIG. 9, the fourth memory device may include a second cathode 60, a second anode 62, and a link 64 horizontally provided on a substrate 70. The substrate 70 may be an insulating layer. A first end of the link 64 is connected to the second anode 62. The second anode 62 and the link 64 may be one unit. However, the second anode 62 may also be provided separately from the link 64, like in the third memory device. A second end (an end portion) of the link 64 is connected to the second cathode 60. The second cathode 60 may be connected to the second end of the link 64 through first through fourth wires L1 through L4 that may have configurations formed of the same material and may be separated from each other. The first through fourth wires L1 through L4 may be provided separately from the substrate 70. That is, the first through fourth wires L1 through L4 may be connection means that connect a top surface of the second cathode 60 to a top surface of the link 64.

The function of the first through fourth wires L1 through L4 may be identical to that of the first through fourth plugs H1 through H4 described above.

The second cathode 60, the second anode 62, and the link 64 may be single layers or multiple layers. If the second cathode 60, the second anode 62, and the link 64 are single layers, the second cathode 60, the second anode 62, and the link 64 may respectively be Cu layers or Al layers. If the second cathode 60, the second anode 62, and the link 64 are multiple layers, the second cathode 60 and the second anode 62 may have a stack structure corresponding or identical to the stack layer structures of the first cathode 40 and the first anode 42 as described above. Also, the first through fourth wires L1 through L4 may be a stack layer in which first through fifth wire layers are sequentially stacked. The first wire layer may be a Ti layer or another metal layer. The second wire layer may be a TiN layer, or may be a nitride layer equivalent to the TiN layer. The third wire layer may be a W layer or another metal layer. The fourth wire layer may be identical to the second wire layer or may be a layer different from the second wire layer. The fifth wire layer may be identical to the first wire layer, or may be a layer different from the first wire layer. Also, the first through fourth wires L1 through L4 may be single layers, and the second cathode 60, the second anode 62 and the link 64 may be multiple layers, or vice versa.

In FIG. 9, both ends of the first through fourth wires L1 through L4 may extend between the substrate 70 and the second cathode 60 and the second anode 62. For example, the second cathode 60 and the second anode 62 respectively may have structures that cover both of the ends of the first through fourth wires L1 through L4. Meanwhile, the first through fourth wires L1 through L4 may contact at least one of the top surfaces of the second cathode 60 and the second anode 62.

The formation of a void in the fourth memory device and the variation in electrical resistance of the fourth memory device according to the formation of the void may be the same as in the first memory device. Thus, the fourth memory device may also store two-bit data. Also, more than two-bit data may be stored according to the number of wires that connect the second cathode 60 to the link 64.

The process of storing data and reading data in the fourth memory device may be the same as the process described for the first memory device.

As described above, the first through fourth memory devices may have simple configurations and structures and may store multi-bit data, thereby simplifying a manufacturing process and increasing integration density.

A method of manufacturing a memory device according to example embodiments will now be described with reference to FIGS. 10 through 12.

Figure 10:
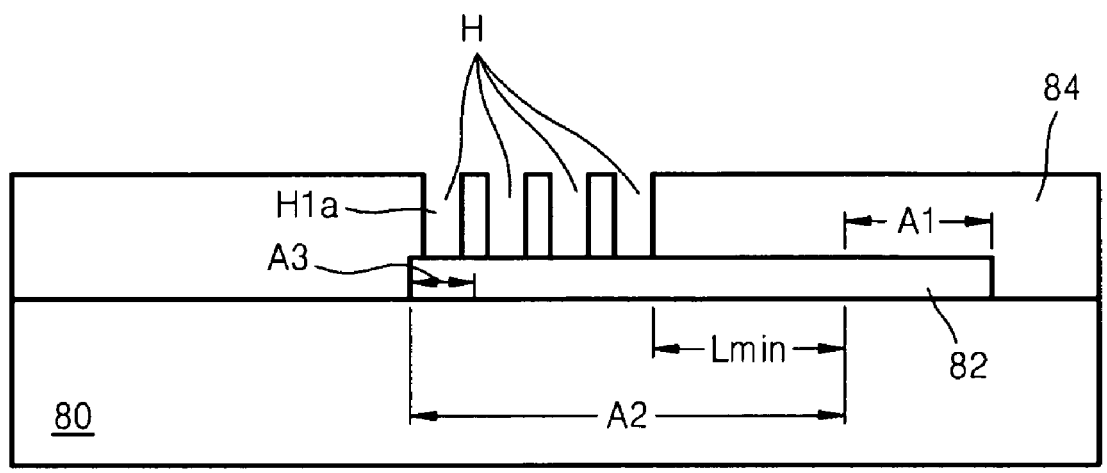
FIGS. 10 through 12 are cross-sectional views illustrating a method of manufacturing the first memory device according to example embodiments.
Figure 11:
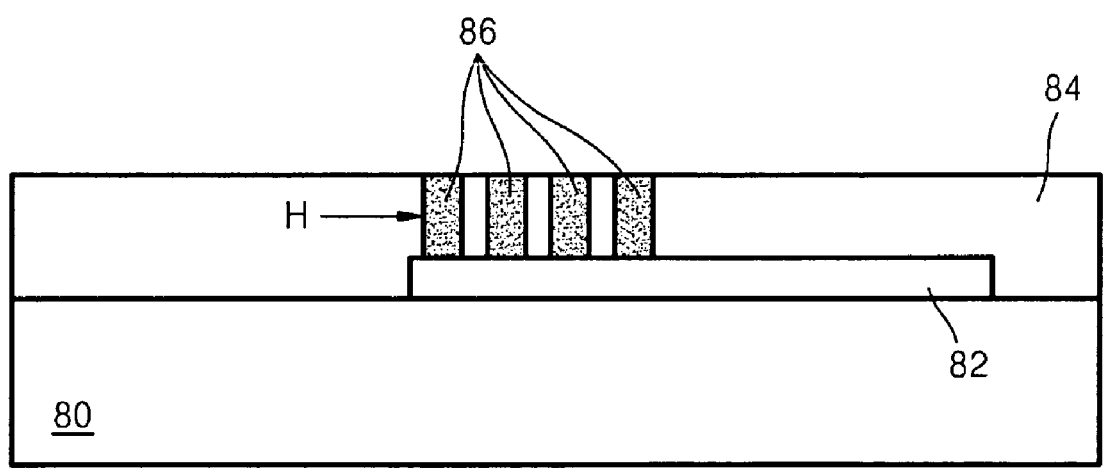
Figure 12:
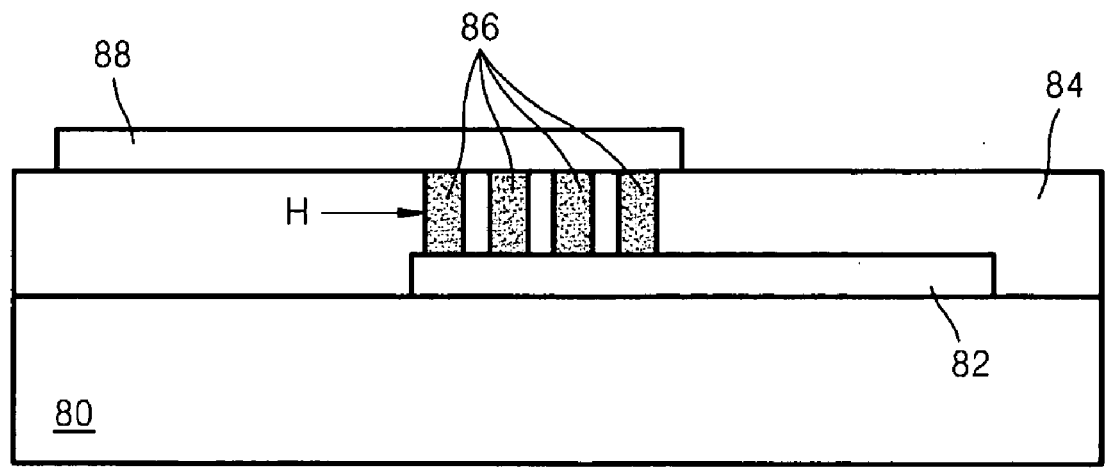

FIGS. 10 through 12 are cross-sectional views illustrating a method of manufacturing the first memory device according to example embodiments.

Referring to FIG. 10, a first conductive layer 82 having a shape is formed on a substrate 80. The substrate 80 may be an interlayer insulating layer or an insulating substrate. The first conductive layer 82 may be formed in a plane shape identical to the shape in which the first anode 42 and the link 44 of the first memory device are combined. Also, the first conductive layer 82 may be formed to a thickness corresponding to the thickness of the first anode 42. The first conductive layer 82 may be formed in a single layer or a multiple layer, and may have a layer configuration as the same as the first anode 42. An interlayer insulating layer 84 that covers the first conductive layer 82 is formed on the substrate 80. The interlayer insulating layer 84 may be, for example, a silicon oxide film, a nitride film, or an insulating material layer formed of another material. A plurality of via holes H through which a portion of the first conductive layer 82 is exposed are formed in the interlayer insulating layer 84. The number of via holes H is determined according to a capacity of a memory device to be formed. For example, if a memory device having a capacity of one bit data is formed, the number of via holes H may be one. However, if a memory device having a capacity of two bit data or more is formed, the number of via holes H may be at least three. Thus, different regions of the first conductive layer 82 are exposed through the via holes H. The regions of the first conductive layer 82 exposed through the via holes H may correspond to end portions of the link 44 that contact the first through fourth plugs H1 through H4 in the first memory device. A distance Lmin between the via hole H and a region A1 corresponding to the first anode 42 of the first conductive layer 82 may be a minimum distance by which a void can be formed in a region corresponding to the link 44 of the first conductive layer 82 due to electromigration.

The minimum distance Lmin may be determined experimentally according to the materials for forming elements, such as the material for forming the link 44 that constitutes the first memory device. The minimum distance Lmin is well known in the art, and thus, a detailed description thereof will be omitted.

Also, a region A2 of the first conductive layer 82 corresponding to the link 44 may have a line width so that the formation of a void can occur from a region A3 that is exposed through the first via hole H1a. The line width may vary according to a material used to form the first conductive layer 82.

The via holes H may be formed using a photolithography method.

Referring to FIG. 11, the via holes H are each filled with a conductive plug 86. The conductive plug 86 may have a layer structure as that of the first through fourth plugs H1 through H4 described in the first memory device. The conductive plug 86 may be formed such that, after forming a plug material layer that fills the via holes H in the interlayer insulating layer 84, the plug material layer is etched until the interlayer insulating layer 84 is exposed. The conductive plug 86 may also be formed using different methods. For example, prior to forming the interlayer insulating layer 84, the conductive plug 86 is formed on a position of the first conductive layer 82 where the conductive plug 86 will be formed, and then, the interlayer insulating layer 84 that covers the first conductive layer 82 formed in advance and the conductive plug 86 is formed on the substrate 80. Then, the interlayer insulating layer 84 is planarized until the conductive plug 86 formed in advance is exposed.

Referring to FIG. 12, a second conductive layer 88 is formed on the interlayer insulating layer 84. The second conductive layer 88 may correspond to the first cathode 40 of the first memory device, and thus, the second conductive layer 88 may be formed to have a thickness corresponding to that of the first cathode 40. Also, the second conductive layer 88 may be formed to have a layer structure corresponding or identical to that of the first cathode 40. The second conductive layer 88 is formed to contact the conductive plug 86.

In this way, the manufacture of a memory device that can store a multi-bit data using multi-plugs is completed.

A memory device formed according to the manufacturing process described with reference to FIGS. 10 through 12 may correspond to the first memory device described above. In the manufacturing process, if the first conductive layer 82 is formed to a shape corresponding to the first cathode 40 and the second conductive layer 88 is formed to a coupled state of the first anode 42 and the link 44, the above manufacturing process may be a manufacturing process of the second memory device.

Figure 13:
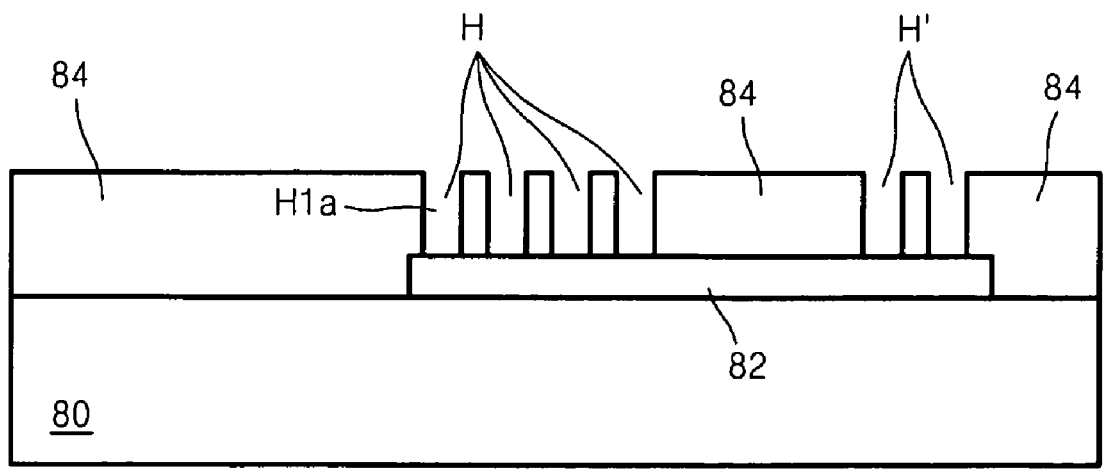
FIGS. 13 through 15 are cross-sectional views illustrating a method of manufacturing the third memory device according to example embodiments.
Figure 14:
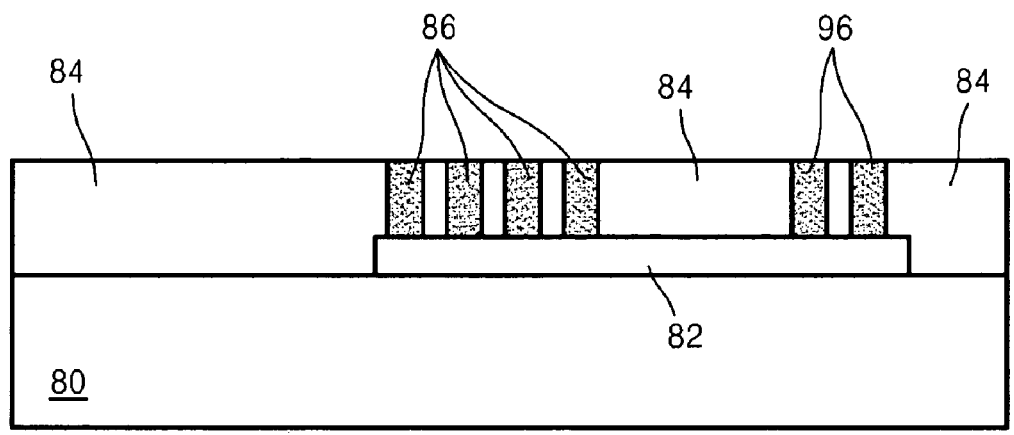
Figure 15:
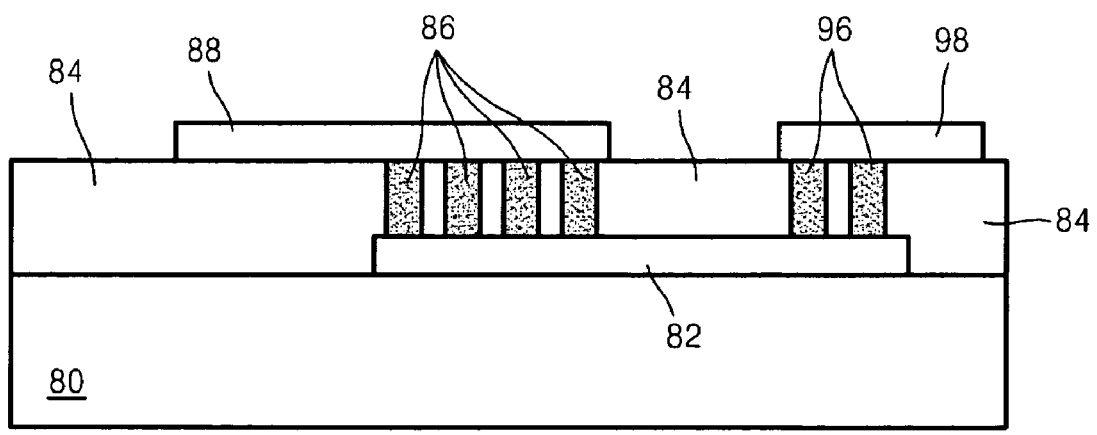

Also, as depicted in FIG. 13, second via holes H' are formed in the interlayer insulating layer 84, and as depicted in FIG. 14, the via holes H and the via holes H' are respectively filled with conductive plugs 86 and second plugs 96. Afterwards, as depicted in FIG. 15, the second conductive layer 88 that contacts the conductive plugs 86 and a third conductive layer 98 that contacts the second plug 96 may be formed on the interlayer insulating layer 84. In example embodiments, the entire first conductive layer 82 may correspond to the link 44, and the second and third conductive layers 88 and 98 respectively may correspond to the first cathode 40 and the first anode 42. A memory device formed in this way may correspond to the third memory device. The first conductive layer 82 and the third conductive layer 98 are connected to each other through the second plugs 96. Thus, the first and third conductive layers 82 and 98 may be considered as a conductive layer that includes the anode and the link.

Figure 16:
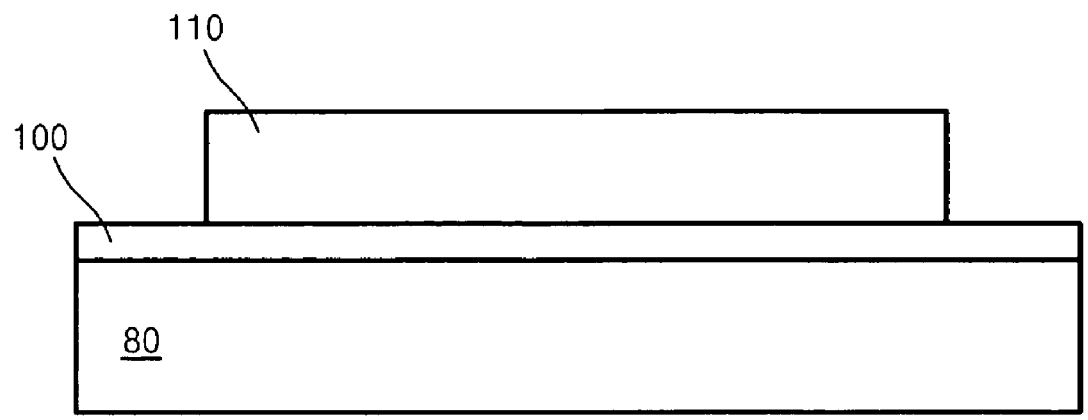
FIGS. 16 through 18 are cross-sectional views illustrating a method of manufacturing the fourth memory device according to example embodiments.
Figure 17:
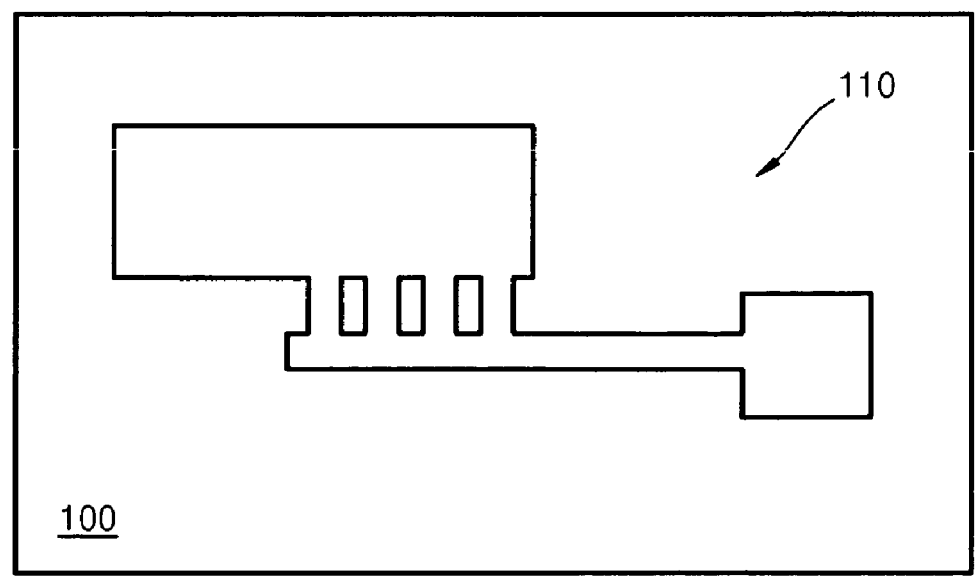
Figure 18:
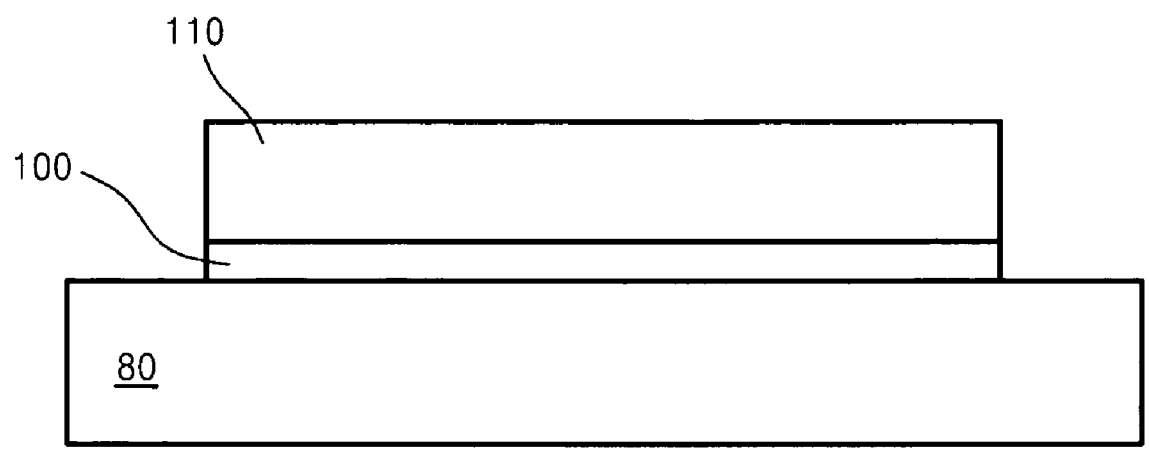

Meanwhile, a memory device in which all constituent elements are formed on the same plane like the fourth memory device may be formed as depicted in FIGS. 16 through 18.

FIGS. 16 through 18 are cross-sectional views illustrating a method of manufacturing the fourth memory device according to example embodiments.

More specifically, a conductive layer 100 is formed on a substrate 80. The conductive layer 100 may be formed in a single layer or a multiple layer, or may be formed corresponding to the layer structure of the first anode 42 of the first memory device. A mask 110 that defines a region where the second cathode 60, the second anode 62, the link 64, and the first through fourth wires L1 through L4 of the fourth memory device will be formed are formed on the conductive layer 100. As a result, as depicted in FIG. 17, the mask 110 may have a plane shape as that of the coupled state of the second cathode 60, the second anode 62, the link 64, and the first through fourth wires L1 through L4 as depicted in FIG. 9. The mask 110 may be a photosensitive film pattern. Then, as depicted in FIG. 18, the conductive layer 100, around the mask 110, is etched until the substrate 80 is exposed. The mask 110 is removed. In this way, a manufacture of the fourth memory device may be completed.

As described above, a memory device according to example embodiments may have a simple configuration, can be manufactured by a simple process, and thus, manufacturing costs can be reduced.

While example embodiments have been shown and described with reference to embodiments thereof, it should not be construed as being limited to such embodiments. Those skilled in this art know that, for example, the memory device may be formed in an array in which a plurality of anodes are connected to a single wide cathode through a plurality of links. Also, the memory device may be formed in an arrangement in which a plurality of anodes are connected, through a plurality of links, to a group of plugs formed on a single wide cathode in a line shape in a direction. Also, the memory devices may be formed in a memory stack in which a plurality of memories are vertically stacked.

Therefore, in the drawings and specification, there have been disclosed example embodiments and, although specific terms are employed, they are used in a generic and descriptive sense only and not for purposes of limitation, the scope of example embodiments being set forth in the following claims.

What is claimed is:

1. A memory device comprising:
a cathode;
an anode;
a link connected to the anode; and
a first connection element that connects the link to the cathode, wherein
the first connection element includes at least one plug.

2. The memory device of claim 1, wherein
the plug is one of a single layer and multiple layer, where the multiple layer includes a central layer and an external layer that surrounds the central layer.

3. The memory device of claim 1, wherein the link and the anode are located in a position lower than a position of the cathode.

4. The memory device of claim 1, wherein the link and the anode are located in a position higher than a position of the cathode.

5. The memory device of claim 1, wherein the cathode, the anode, the link, and the first connection element are formed on the same plane.

6. The memory device of claim 1, wherein the cathode, the anode, and the link are formed on the same plane and the first connection element is separately formed from the plane.

7. The memory device of claim 1, wherein the cathode and the anode are located in a position higher than a position of the link.

8. The memory device of claim 7, wherein the anode and the link are connected through a second connection element.

9. The memory device of claim 8, wherein the second connection element includes at least one plug, and
the plug is one of a single layer and multiple layers, where the multiple layer includes a central layer and an external layer that surrounds the central layer.

10. The memory device of claim 1, wherein the cathode, the anode, and the link are formed in one of a single layer and a multiple layer.

11. The memory device of claim 1, wherein the cathode, the anode, the link, and the first connection element are one of single layers and multiple layers.

12. The memory device of claim 1, wherein the memory device writes data by applying a single voltage between the cathode and the anode, wherein the memory device reads the written data by measuring resistance between the cathode and the anode using a voltage in a range that does not form a void in the link applied between the cathode and the anode and by comparing the measured resistance with a reference resistance.

13. The memory device of claim 1, wherein the link includes at least first, second and third material layers, where the second layer is between the first and third material layers and the second layer is a conductive layer.

14. The memory device of claim 13, wherein at least one of the first and third material layers are one of Ta and TiN layers.

15. The memory device of claim 13, wherein the link further includes a fourth material layer above the first material layer and fifth material layer below the third material layer, and
at least one of the fourth and fifth material layers are one of Ti and TaN layers.

16. The memory device of claim 1, wherein the cathode corresponds to a gate line, the anode and the link correspond to a metal wire connected to the gate line, and the first connection element connects the gate line to the metal wire.

17. The memory device of claim 16, wherein the first connection element includes at least one wire, and the at least one wire extends between a substrate and the cathode and between the substrate and the anode, wherein the least one wire, the cathode and the anode are formed on the substrate.

18. The memory device of claim 16, wherein the cathode includes at least an upper layer and a lower layer, where the lower layer and the upper layer are a polysilicon layer and a silicide material layer, respectively.

19. The memory device of claim 18, wherein the material layers are sequentially stacked.

20. A memory device comprising:
a cathode;
an anode;
a link that is connected to the anode; and
a first connection element that connects the link to the cathode, where the first connection element includes a plurality of plugs, wherein
the link varies an electrical resistance between the cathode and the anode by selectively contacting one or more of the plurality of plugs based on a voltage applied between the cathode and the anode.

* * * * *